(12) United States Patent
Johnson

(10) Patent No.: US 10,058,004 B1
(45) Date of Patent: Aug. 21, 2018

(54) INTERLOCK ASSEMBLY

(71) Applicant: EMC IP Holding Company, LLC, Hopkinton, MA (US)

(72) Inventor: Keith C. Johnson, Medway, MA (US)

(73) Assignee: EMC IP Holding Company LLC, Hopkinton, MA (US)

(*) Notice: Subject to any disclaimer, the term of this patent is extended or adjusted under 35 U.S.C. 154(b) by 0 days.

(21) Appl. No.: 15/662,930

(22) Filed: Jul. 28, 2017

(51) Int. Cl.
*H05K 5/00* (2006.01)
*H01R 13/46* (2006.01)
*H05K 7/16* (2006.01)
*H05K 7/00* (2006.01)
*H05K 1/14* (2006.01)
*H05K 7/14* (2006.01)
*H05K 5/02* (2006.01)

(52) U.S. Cl.
CPC ......... *H05K 7/1488* (2013.01); *H05K 5/0021* (2013.01); *H05K 5/0208* (2013.01); *H05K 5/0217* (2013.01)

(58) Field of Classification Search
CPC ............................ H05K 7/1488; H05K 5/0208
USPC ......... 174/520; 361/727, 728, 730, 732, 740
See application file for complete search history.

(56) References Cited

U.S. PATENT DOCUMENTS

| | | | |
|---|---|---|---|
| 6,615,993 B1 * | 9/2003 | Rudiger | H05K 7/1489 211/175 |
| 7,573,726 B1 * | 8/2009 | Cote | H05K 7/1405 361/726 |
| 7,850,013 B1 * | 12/2010 | Kramer | E05B 73/0082 211/26 |
| 2014/0204537 A1 * | 7/2014 | Rust | G11B 33/128 361/727 |

* cited by examiner

*Primary Examiner* — Sherman Ng
(74) *Attorney, Agent, or Firm* — Krishnendu Gupta; Konrad R. Lee

(57) ABSTRACT

An openable IT component is configured to be mounted within an IT rack and includes a shell assembly. A drawer assembly is configured to receive a plurality of IT subcomponents. A slide assembly is configured to slidably position the drawer assembly within the shell assembly between a fully closed position and a fully opened position. An interlock assembly is configured to prevent the opening of other IT components within the IT rack while the openable IT component is not in the fully closed position.

16 Claims, 8 Drawing Sheets

# INTERLOCK ASSEMBLY

TECHNICAL FIELD

This disclosure relates to interlock assemblies and, more particularly, to interlock assemblies for use within IT devices.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, various IT components are mounted within IT racks that are configured to allow these IT components to be slid into (and slid out of) these IT racks for servicing purposes. Unfortunately, due to the weight of these IT components, care must be taken to prevent these IT racks from toppling over due to too many IT components being slid out at the same time.

SUMMARY OF DISCLOSURE

In one implementation, an openable IT component is configured to be mounted within an IT rack and includes a shell assembly. A drawer assembly is configured to receive a plurality of IT sub-components. A slide assembly is configured to slidably position the drawer assembly within the shell assembly between a fully closed position and a fully opened position. An interlock assembly is configured to prevent the opening of other IT components within the IT rack while the openable IT component is not in the fully closed position.

One or more of the following features may be included. The interlock assembly may include an interlock window and a collapsible link assembly. The interlock window may be positioned within the shell assembly and may be configured to be displaceable in a first direction in response to the drawer assembly being slid out of the fully closed position. A fixed support rail may be configured to position the shell assembly within the IT rack. The collapsible link assembly may be positioned within the fixed support rail. The collapsible link assembly may include a collapsible button assembly positioned proximate an inner surface of the fixed support rail, The collapsible button assembly may be configured to be displaceable in a second direction in response to the shell assembly being installed onto the fixed support rail. The collapsible button assembly may be configured to interface with the interlock window. The collapsible link assembly may include a pin assembly coupled to the collapsible button assembly and positioned proximate an outer surface of the fixed support rail. The pin assembly may be configured to be displaceable in the first direction in response to displacement of the interlock window in the first direction. The pin assembly may be configured to interface with a drawer interlock mechanism included within the IT rack. The drawer interlock mechanism may be configured to prevent the opening of other IT components within the IT rack while the openable IT component is not in the fully closed position. The interlock assembly may be configured to pass through a fixed support rail configured to position the shell assembly within the IT rack. The plurality of IT sub-components includes one or more of: a storage module, a compute module, a memory module, a networking module, and a virtualization module.

In another implementation, an interlock assembly is configured for use in an openable IT component including a shell assembly and a drawer assembly. The interlock assembly includes an interlock window positioned within the shell assembly and configured to be displaceable in a first direction in response to the drawer assembly being slid out of a fully closed position. A collapsible link assembly is positioned within a fixed support rail.

One or more of the following features may be included. The collapsible link assembly may include a collapsible button assembly positioned proximate an inner surface of the fixed support rail. The collapsible button assembly may be configured to be displaceable in a second direction in response to the shell assembly being installed onto the fixed support rail. The collapsible button assembly may be configured to interface with the interlock window. The collapsible link assembly may include a pin assembly coupled to the collapsible button assembly and positioned proximate an outer surface of the fixed support rail. The pin assembly may be configured to be displaceable in the first direction in response to displacement of the interlock window in the first direction. The pin assembly may be configured to interface with a drawer interlock mechanism included within an IT rack.

In another implementation, an interlock assembly is configured for use in an openable IT component including a shell assembly and a drawer assembly. The interlock assembly includes an interlock window positioned within the shell assembly and configured to be displaceable in a first direction in response to the drawer assembly being slid out of a fully closed position. A collapsible link assembly is positioned within a fixed support rail. The collapsible link assembly includes a collapsible button assembly positioned proximate an inner surface of the fixed support rail. The collapsible button assembly is configured to be displaceable in a second direction in response to the shell assembly being installed onto the fixed support rail and is configured to interface with the interlock window. The collapsible link assembly includes a pin assembly coupled to the collapsible button assembly and positioned proximate an outer surface of the fixed support rail. The pin assembly is configured to be displaceable in the first direction in response to displacement of the interlock window in the first direction and is configured to interface with a drawer interlock mechanism included within the IT rack. The drawer interlock mechanism is configured to prevent the opening of other IT components within an IT rack while the openable IT component is not in the fully closed position.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE PREFERRED EMBODIMENTS

Figure 1:
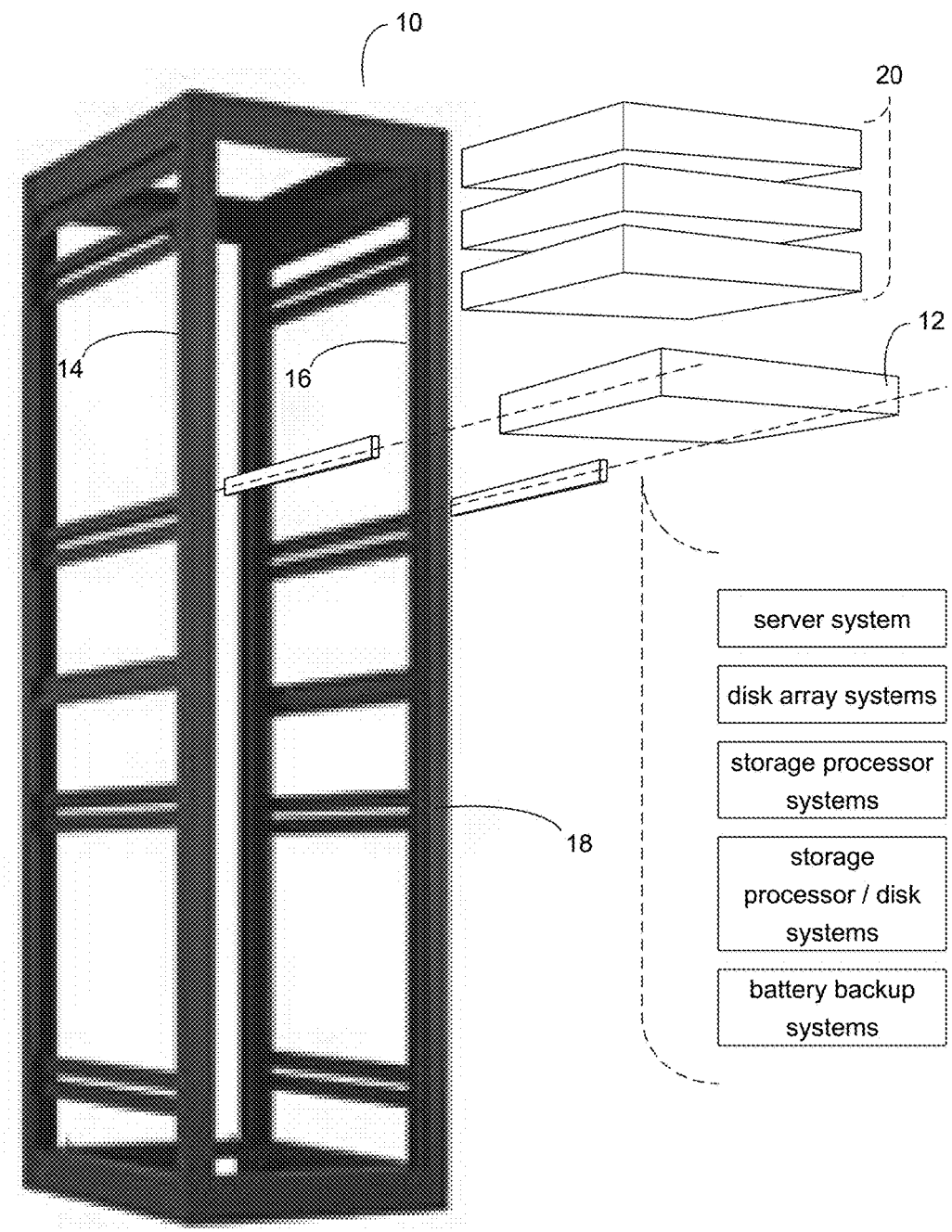
FIG. 1 is a perspective view of an IT rack and an openable IT component.

Referring to FIG. 1, IT racks (e.g., IT rack 10) may be utilized to store and organize IT components. For example, IT rack 10 may be placed within a computer room and various IT components (e.g., openable IT component 12) may be attached to rails (e.g., NEMA rails 14, 16) included within IT rack 10, wherein these rails (e.g., NEMA rails 14, 16) may have a standard and defined spacing between them (e.g., 19"). Typically, IT components (e.g., openable IT component 12) that are configured to fit within IT rack 10 may be described as rack-mountable IT components.

Examples of the various IT components (e.g., openable IT component 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT components (e.g., openable IT component 12) within IT rack 10. By standardizing the spacing between NEMA rails 14, 16, the various IT components (e.g., openable IT component 12) that fit within a first IT rack may also fit within a second IT rack.

Typically, IT racks (e.g., IT rack 10) are defined in accordance with the number of rack units (U's) included within the rack. For example, a 1U IT component is half as high as a 2U IT component, which is half as high as a 4U IT component. Accordingly, while the number of rack units available within a particular IT rack may be rigidly defined by the size of the IT rack, the number of IT components mountable within that IT rack may vary depending upon the size (in rack units) of the particular IT components being mounted within that IT rack. Therefore, by reducing the number of rack units that a particular IT component uses within an IT rack, additional IT computing devices may be mounted within the IT rack.

Figure 2:
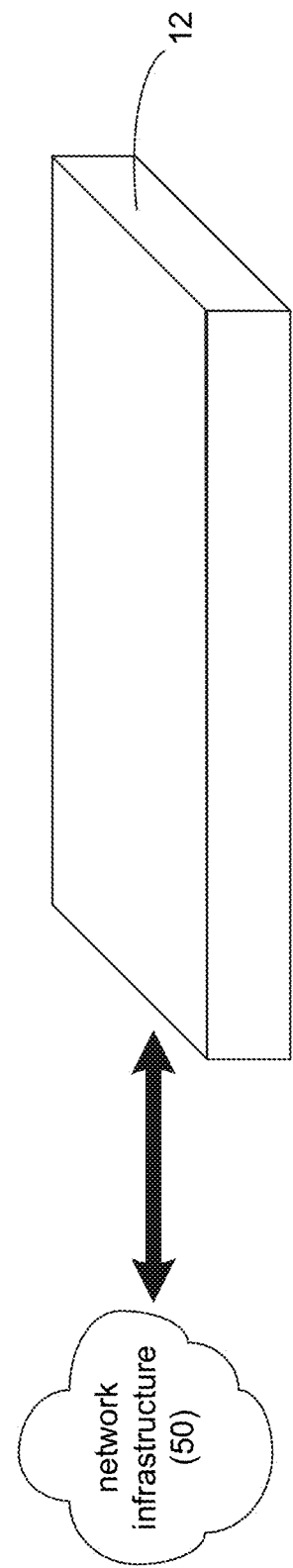
FIG. 2 is a diagrammatic view of an openable IT component for use within the IT rack of FIG. 1.

Referring to FIG. 2, there is shown one implementation of openable IT component 12 that includes a plurality of individual components, examples of which may include but are not limited to storage components, input/output components, and processing components, any of which may be a field replaceable unit (FRU) that is serviceable in the field.

The storage components may be the portion of openable IT component 12 that is configured to store data. Examples of such data may include but are not limited to data that is generated remotely (e.g., by applications that are executed on remote devices) or data that is generated locally (e.g., by applications that are executed on openable IT component 12). Accordingly, these storage components may be configured to include one or more storage devices, examples of which may include but are not limited to one or more rotating-media disk drives (e.g., SATA drives or SCSI drives) and/or one or more solid state storage devices (e.g., flash drives).

The input/output components of openable IT component 12 may be the portion of openable IT component 12 that is configured to couple openable IT component 12 to a network infrastructure (e.g., network infrastructure 50), wherein network infrastructure 50 may be configured to couple openable IT component 12 to other rack-mountable computing devices, other IT components (e.g., server systems, disk array systems, storage processor systems, storage processor/disk systems, and battery backup systems), other networking devices (e.g., switches, routers, bridges, wireless access points), and/or end user computing devices (e.g., desktop computers, laptop computers, notebook computers, smartphones, tablet computers, etc.). Examples of network infrastructure 50 may include but are not limited to an Ethernet infrastructure; a fiber channel infrastructure; and an infiniband infrastructure.

The processing components of openable IT component 12 may be the portion of openable IT component 12 that is configured to process data, such as data that is generated remotely (e.g., by applications that are executed on remote devices) or data that is generated locally (e.g., by applications that are executed on openable IT component 12). Accordingly, the processing components of openable IT component 12 may be configured to include one or more microprocessors.

Figure 3:
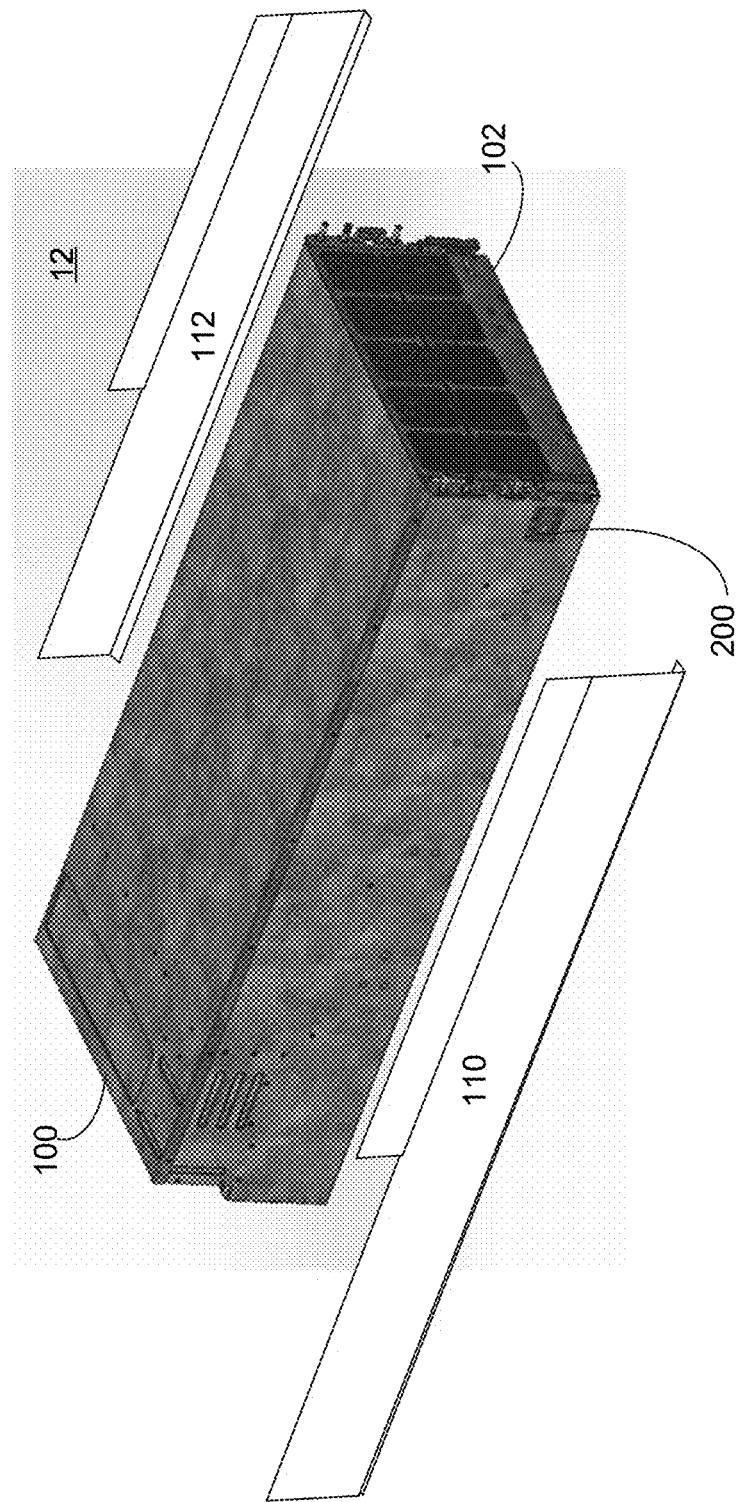
FIGS. 3-4 are diagrammatic views of the openable IT component of FIG. 2.
Figure 4:
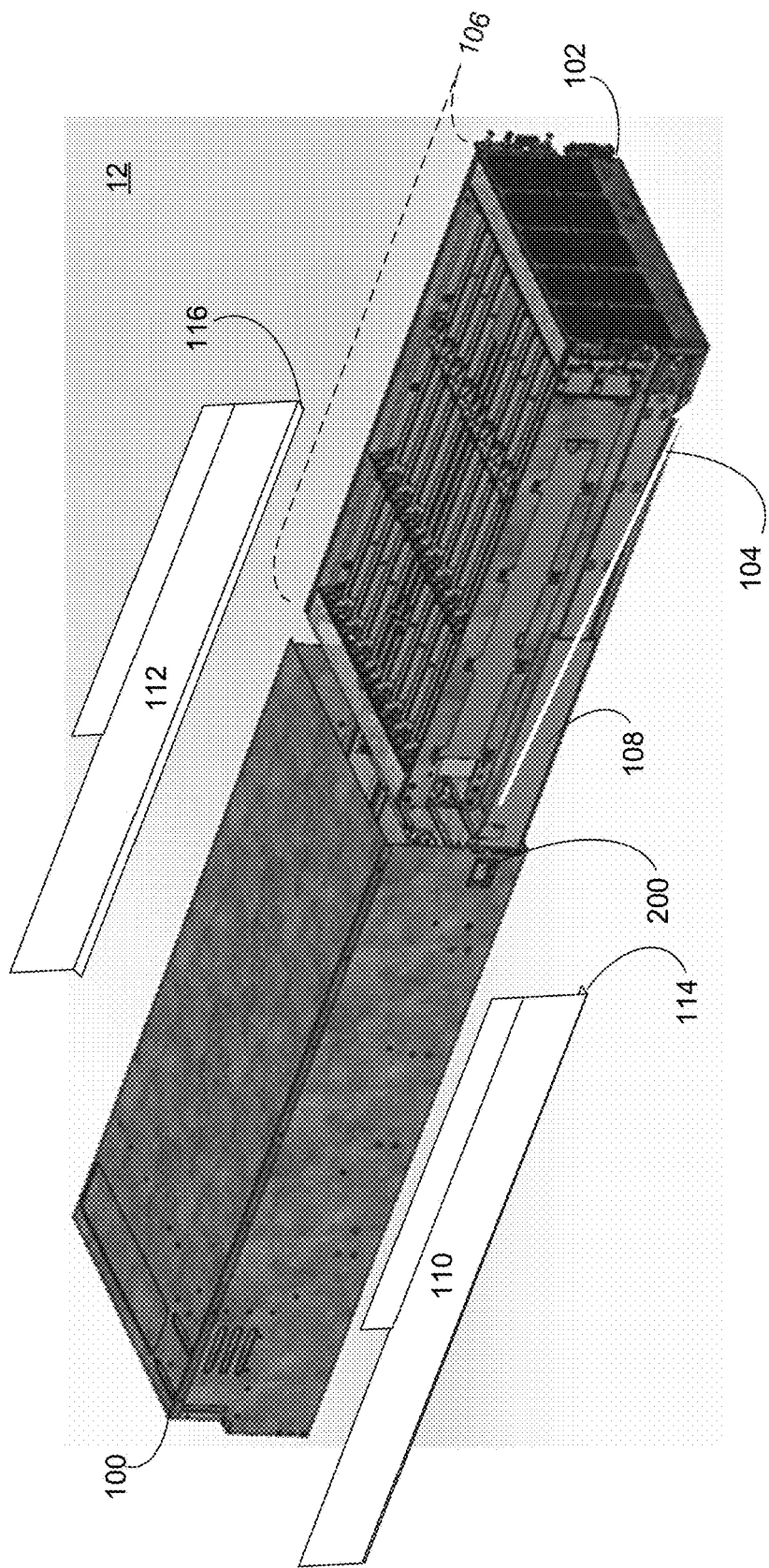

Referring also to FIGS. 3-4, there is shown another implementation of openable IT component 12. In this particular example, openable IT component 12 is shown to be a hyper-converged IT component. As is known in the art, a hyper-converged IT component is a type of IT component that tightly integrates compute resources, storage resources, networking resources, virtualization resources, and other technologies into a single enclosure/chassis supported by a single vendor.

As openable IT component 12 may be quite large and quite densely packed, the enclosure/chassis of openable IT component 12 may be configured in a drawer fashion, wherein openable IT component 12 may include a fixed portion (e.g., shell assembly 100) that may be rigidly affixed to IT rack 10. Openable IT component 12 may also include a slidable portion (e.g., drawer assembly 102) that may be configured to slide forward (in the direction of arrow 104) out of shell assembly 100 (and out of the front of IT rack 10).

Drawer assembly 102 may be configured to receive plurality of IT sub-components 106, examples of which may include but are not limited to storage modules, compute modules, memory modules, networking modules, and virtualization modules of openable IT component 12. Additionally, drawer assembly 102 of openable IT component 12 may be configured so that IT sub-components 106 included within openable IT component 12 may all be accessible and serviceable through the open top of drawer 102 once drawer 102 is slid forward and is clear of shell assembly 100, as there typically will be other IT components (e.g., IT components 20, FIG. 1) mounted directly above openable IT component 12.

Openable IT component 12 may include one or more slide assemblies (e.g., slide assembly 108), wherein slide assembly 108 may be configured to slidably position drawer assembly 102 within shell assembly 100 between a fully closed position (as shown in FIG. 3) and a fully opened position (as shown in FIG. 4). An example of slide assembly 108 may include but is not limited to a ball-bearing slide assembly that is positioned between shell assembly 100 and drawer assembly 102. Slide assembly 108 may be configured to include a first detent that is configured to position drawer assembly 102 in the fully closed position (as shown in FIG. 3) and a second detent that is configured to position drawer assembly 102 in the fully open position (as shown in FIG. 4), wherein drawer assembly 102 may be slidably positionable into any position between (or including) the fully closed position (of FIG. 3) and the fully opened position (of shown in FIG. 3).

Openable IT component 12 may also include one or more fixed support rails (e.g., fixed support rails 110, 112) that may be configured to position shell assembly 100 of openable IT component 12 within IT rack 10. For example, fixed support rails 110, 112 may be configured to allow openable IT component 12 to be installed within IT rack 10, wherein e.g., fixed support rails 110, 112 may be fastened to IT rack 10 and then openable IT component 12 may be slide onto (and supported by) lips 114, 116 of fixed support rails 110, 112 (respectively) and locked into place (with respect to fixed support rails 110, 112 and IT rack 10).

Openable IT component 12 may include an interlock assembly that is configured to prevent the opening of other IT components (e.g., IT components 20, FIG. 1) within IT rack 10 while openable IT component 12 is not in the fully closed position (as shown in FIG. 3). Specifically, due to the size and weight of the various IT components included within IT rack 10, in the event that multiple IT components are simultaneously slid out of IT rack 10, there is a chance that IT rack 10 could topple over onto the person servicing IT rack 10. Accordingly and to avoid such a situation, IT rack 10 may be designed to prevent more than one IT component from being simultaneously slide out of IT rack 10.

Figure 6:
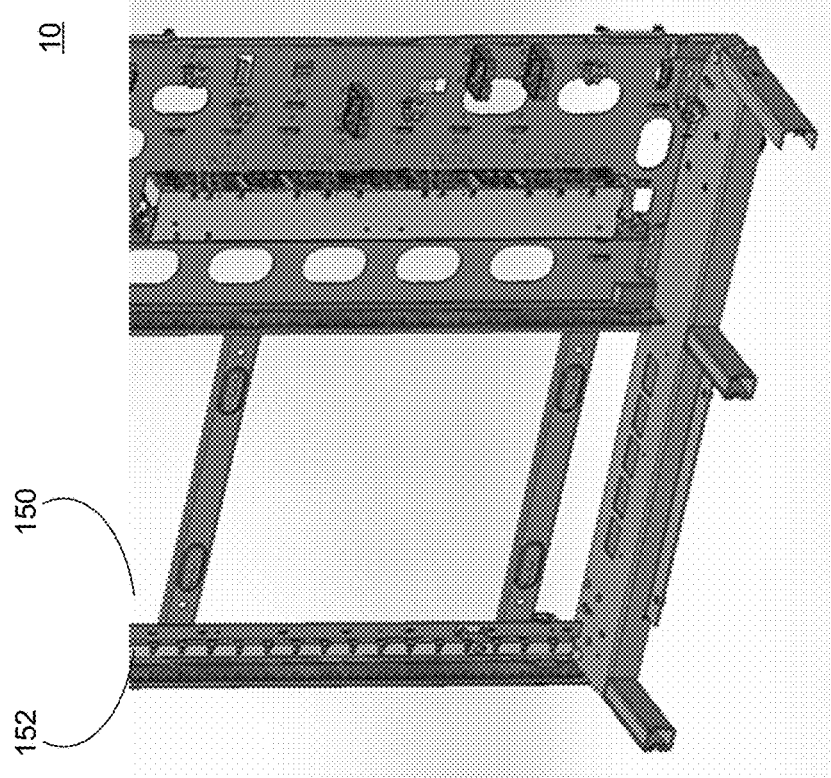
FIGS. 5-6 are detail views of the IT rack of FIG. 1.
Figure 5:
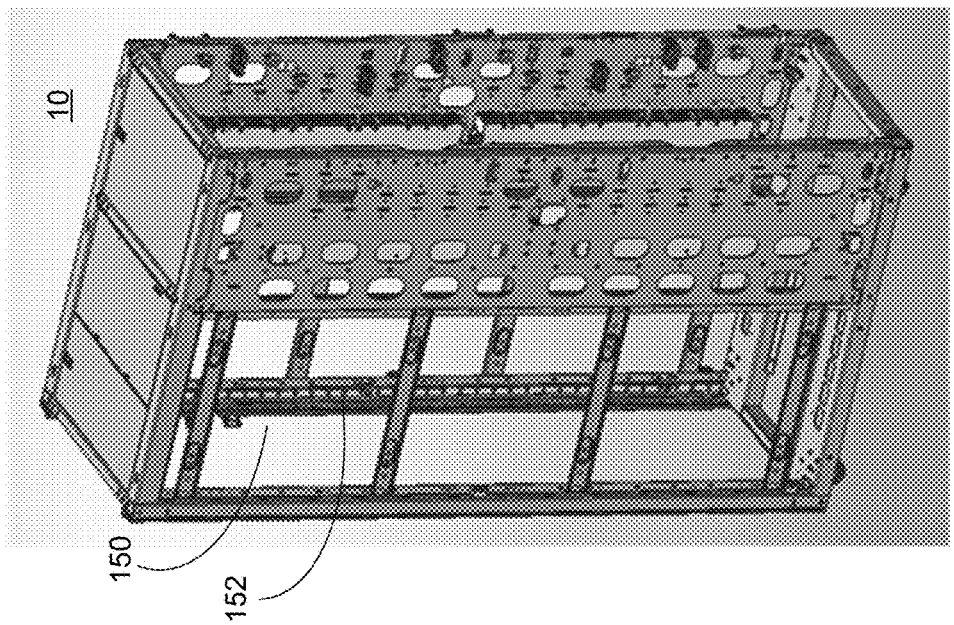

Referring also to FIGS. 5-6, there is shown another implementation of IT rack 10 that may be configured to prevent multiple IT components from being simultaneously slide out of IT rack 10. Specifically and in this implementation, IT rack 10 is shown to include drawer interlock mechanism 150 that may be configured to prevent the opening of other IT components within IT rack 10 (e.g., one or more of IT components 20, FIG. 1) while openable IT component 12 is not in the fully closed position (as shown in FIG. 3), thus preventing (or reducing the possibility of) IT rack 10 toppling over.

One example of drawer interlock mechanism 150 may include one or more actuation rods (e.g., actuation rod 152) positioned within (or proximate) frame 18 of IT rack 10, wherein actuation rod 152 may be displaced from a first position (e.g., a downward position) to a second position (e.g., an upward position) whenever any IT component within IT rack 10 is slid out of IT rack 10, wherein once actuation rod 152 is in the upward position, no additional IT components may be slid out of IT rack 10. Accordingly and in such an implementation of IT rack 10, multiple IT components may not be simultaneously slid out of IT rack 10.

The above-mentioned interlock assembly may include a plurality of components that result in (in this example) the upward displacement of actuation rod 152 whenever drawer assembly 102 is moved out of the fully closed position (as shown in FIG. 3), thus preventing the opening of other IT components (e.g., IT components 20, FIG. 1) within IT rack 10 whenever openable IT component 12 is not in the fully closed position (as shown in FIG. 3).

Figure 7:
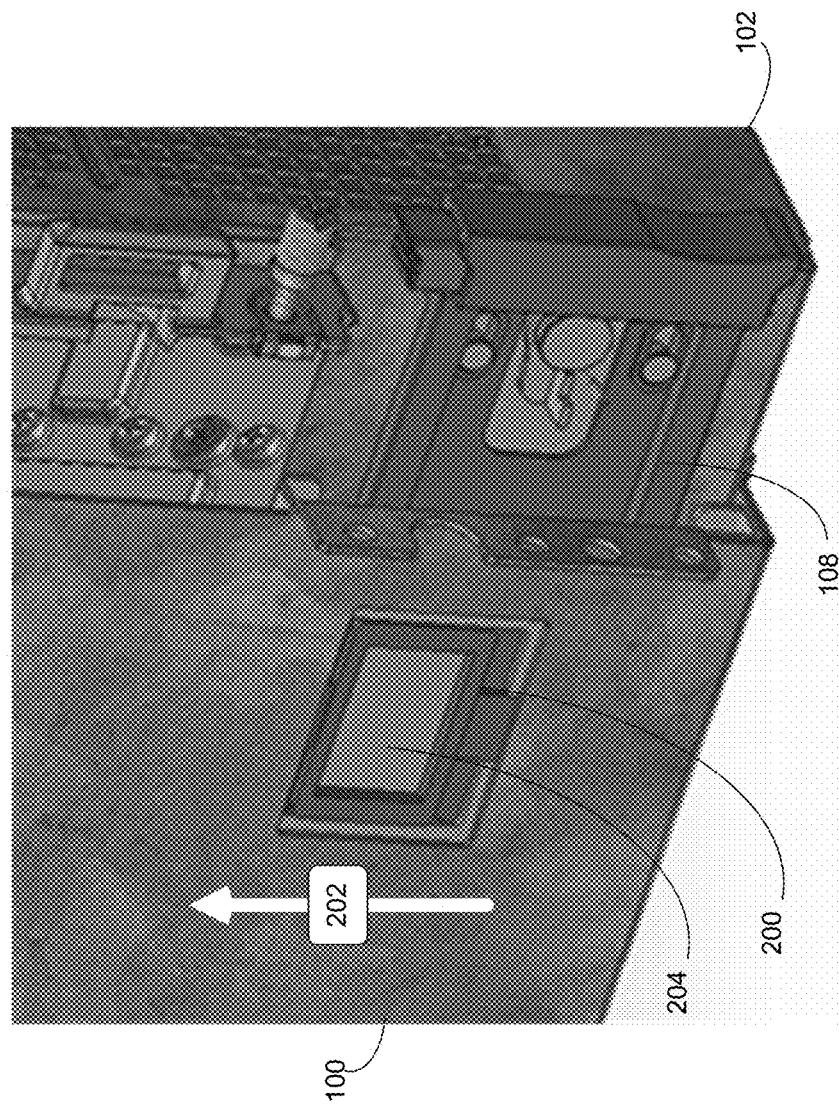
FIG. 7 is a detail view of an interlock window for use with the IT rack of FIG. 1.

Referring also to FIG. 7, the above-described interlock assembly may include interlock window 200. Interlock window 200 may be positioned within shell assembly 100 of openable IT component 12 and may be configured to be displaceable in a first direction (e.g., the direction of arrow 202) in response to drawer assembly 102 being slid out of the fully closed position (as shown in FIG. 3). Accordingly and when drawer assembly 102 is in the fully closed position, interlock window may be positioned downward and, upon drawer assembly 102 being moved out of the fully closed position (as shown in FIG. 3), interlock window 200 may move upward in the direction of arrow 202. Interlock window 200 may include recess 204 (to be discussed below).

Figure 8:
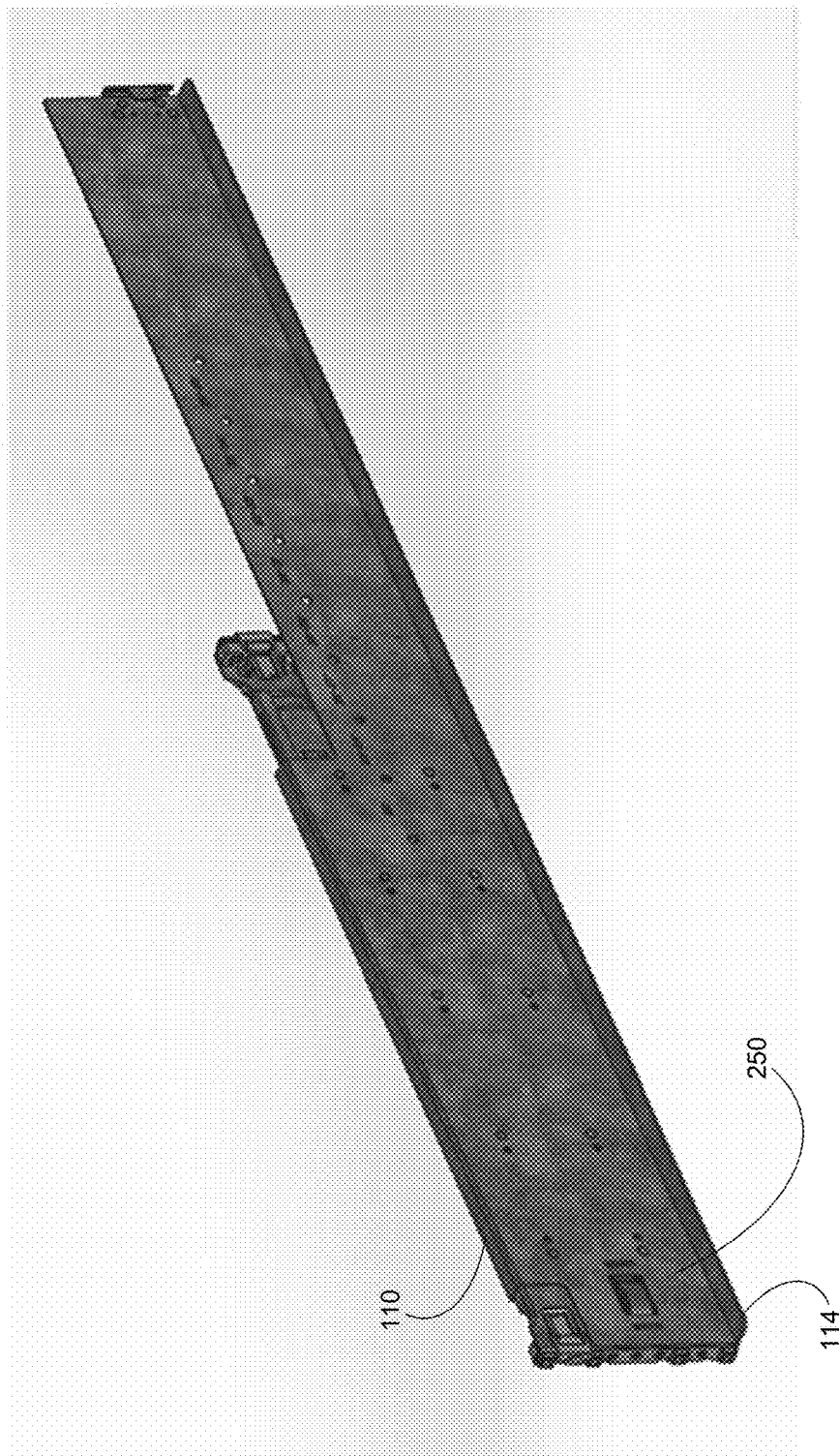
FIG. 8 is a detail view of a fixed rail assembly for use with the IT rack of FIG. 1.
Figure 10:
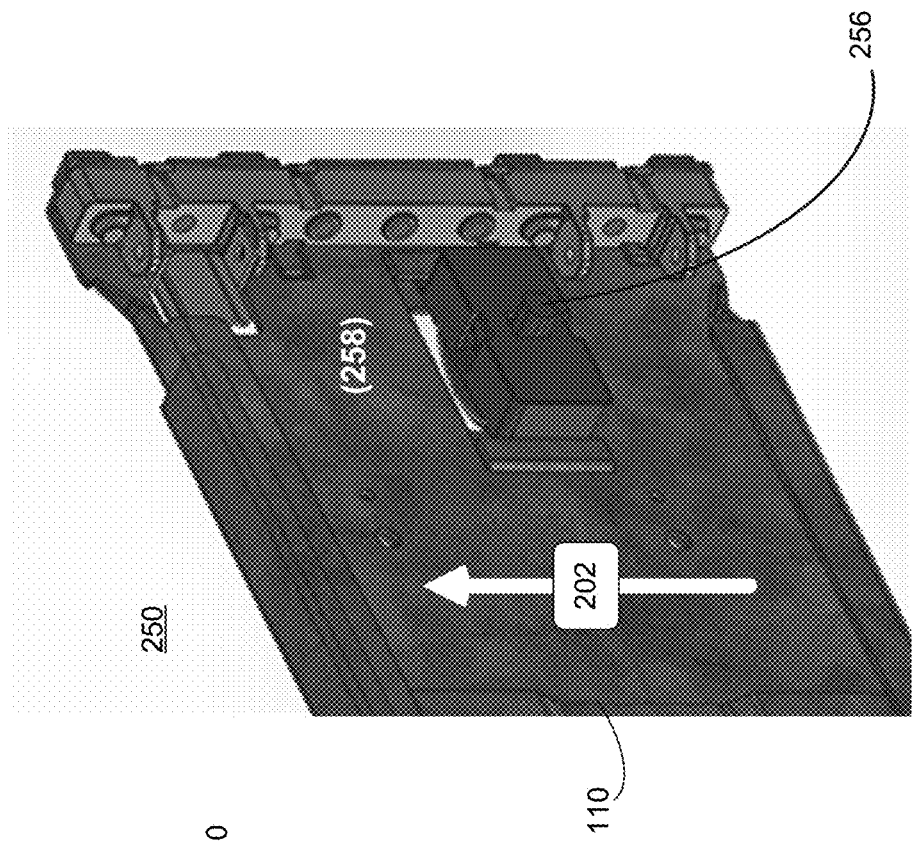
FIGS. 9-10 are detail views of a collapsible pin assembly for use with the IT rack of FIG. 1.
Figure 9:
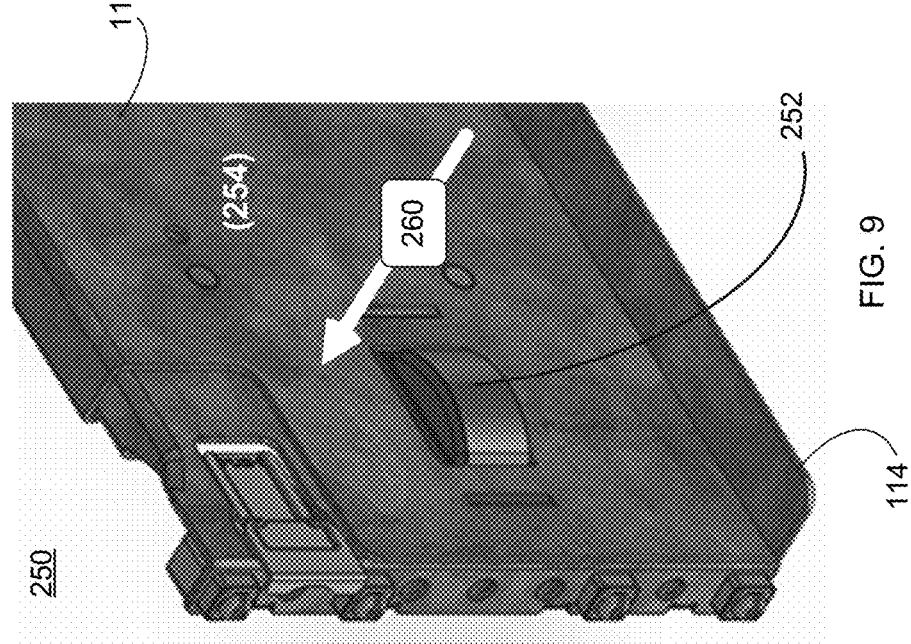

Referring also to FIG. 8-10, the above-described interlock assembly may include collapsible link assembly 250, wherein collapsible link assembly 250 may be positioned within (and pass through) a fixed support rail (e.g., one or more of fixed support rails 110, 112). In one implementation, collapsible link assembly 250 may include collapsible button assembly 252 that may be positioned proximate an inner surface (e.g., inner surface 254) of the fixed support rail (e.g., one or more of fixed support rails 110, 112). Inner surface 254 of (in this example) fixed support rail 110 may be the surface to which openable IT component 12 is attached.

Collapsible link assembly 250 may further include pin assembly 256 coupled to collapsible button assembly 252 (e.g., through the fixed support rail) and may be positioned proximate an outer surface (e.g., outer surface 258) of the fixed support rail (e.g., one or more of fixed support rails 110, 112). Outer surface 258 of (in this example) fixed support rail 110 may be the surface to which IT rack 10 is attached.

Collapsible button assembly 252 may be configured to be displaceable in a second direction (the direction of arrow 260) in response to shell assembly 102 being installed onto (in this example) fixed support rail 110. Specifically, collapsible button assembly 252 may be a spring-loaded button assembly. Accordingly and during installation of openable IT component 12 within IT rack 10, fixed support rails 110, 112 may be fastened to IT rack 10 and then openable IT component 12 may be placed onto lips 114, 116 of fixed support rails 110, 112 and slid into IT rack 10.

When, during this installation procedure, shell assembly 100 of openable IT component 12 may make contact with collapsible button assembly 252, collapsible button assembly 252 may be displaced (in the direction of arrow 260), thus allowing shell assembly 100 to continue to slide into IT rack 10.

Collapsible button assembly 252 may be configured to interface with interlock window 200. Accordingly, when openable IT component 12 is fully seated within IT rack 10, collapsible button assembly 252 will be aligned with interlock window 200, thus allowing collapsible button assembly 252 to return to its normal position. Specifically, collapsible button assembly 252 will now be positioned within recess 204 of interlock window 200 (which is sized to receive the same).

As discussed above, interlock window 200 may be configured to be displaceable in a first direction (e.g., the direction of arrow 202) in response to drawer assembly 102 being slid out of the fully closed position (as shown in FIG. 3). Further and as discussed above, collapsible button assembly 252 may be configured to interface with interlock window 200 and pin assembly 256 may be coupled to collapsible button assembly 252. Accordingly, pin assembly 256 may be configured to be displaceable in the first direction (e.g., the direction of arrow 202) in response to displacement of interlock window 200 in the first direction (e.g., the direction of arrow 202). Specifically, any movement of interlock window 200 (in the direction of arrow 202) in response to drawer assembly 102 being slid out of the fully closed position (as shown in FIG. 3) will result in displacement of pin assembly 256 (in the direction of arrow 202).

Pin assembly 256 may be configured to interface with drawer interlock mechanism 150 (generally) and actuation rod 152 (specifically). Accordingly, any upward movement of pin assembly 256 (e.g., due to drawer assembly 102 being slid out of the fully closed position) will result in upward movement of actuation rod 152. As discussed above, once actuation rod 152 is displaced upward, no additional IT components may be slid out of IT rack 10. Accordingly and in such an implementation of IT rack 10, multiple IT components may not be simultaneously slid out of IT rack 10.

General:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. An openable IT component configured to be mounted within an IT rack, the openable IT component comprising: a shell assembly; a drawer assembly configured to receive a plurality of IT sub-components; a slide assembly configured to slidably position the drawer assembly within the shell assembly between a fully closed position and a fully opened position; a fixed support rail configured to position the shell assembly within the IT rack, and an interlock assembly configured to prevent the opening of other IT components within the IT rack while the openable IT component is not in the fully closed position, wherein the interlock assembly includes: an interlock window; and a collapsible link assembly, wherein the interlock window is positioned within the shell assembly and is configured to be displaceable in a first direction in response to the drawer assembly being slid out of the fully closed position, and wherein the collapsible link assembly is positioned within the fixed support rail.

2. The openable IT component of claim 1 wherein the collapsible link assembly includes: a collapsible button assembly positioned proximate an inner surface of the fixed support rail, the collapsible button assembly configured to be displaceable in a second direction in response to the shell assembly being installed onto the fixed support rail.

3. The openable IT component of claim 1 wherein the collapsible button assembly is configured to interface with the interlock window.

4. The openable IT component of claim 1 wherein the collapsible link assembly includes: a pin assembly coupled to the collapsible button assembly and positioned proximate an outer surface of the fixed support rail.

5. The openable IT component of claim 1 wherein the pin assembly is configured to be displaceable in the first direction in response to displacement of the interlock window in the first direction.

6. The openable IT component of claim 1 wherein the pin assembly is configured to interface with a drawer interlock mechanism included within the IT rack.

7. The openable IT component of claim 1 wherein the drawer interlock mechanism is configured to prevent the opening of other IT components within the IT rack while the openable IT component is not in the fully closed position.

8. The openable IT component of claim 1 wherein the interlock assembly is configured to pass through a fixed support rail configured to position the shell assembly within the IT rack.

9. The openable IT component of claim 1 wherein the plurality of IT subcomponents includes one or more of: a storage module, a compute module, a memory module, a networking module, and a virtualization module.

10. An interlock assembly configured for use in an openable IT component including a shell assembly and a drawer assembly, the interlock assembly comprising: an interlock window positioned within the shell assembly and configured to be displaceable in a first direction in response to the drawer assembly being slid out of a fully closed position; and a collapsible link assembly positioned within a fixed support rail.

11. The interlock assembly of claim 10 wherein the collapsible link assembly includes: a collapsible button assembly positioned proximate an inner surface of the fixed support rail, the collapsible button assembly configured to be displaceable in a second direction in response to the shell assembly being installed onto the fixed support rail.

12. The interlock assembly of claim 11 wherein the collapsible button assembly is configured to interface with the interlock window.

13. The interlock assembly of claim 12 wherein the collapsible link assembly includes: a pin assembly coupled to the collapsible button assembly and positioned proximate an outer surface of the fixed support rail.

14. The interlock assembly of claim 13 wherein the pin assembly is configured to be displaceable in the first direction in response to displacement of the interlock window in the first direction.

15. The interlock assembly of claim 14 wherein the pin assembly is configured to interface with a drawer interlock mechanism included within an IT rack.

16. An interlock assembly configured for use in an openable IT component including a shell assembly and a drawer assembly, the interlock assembly comprising: an interlock window positioned within the shell assembly and configured to be displaceable in a first direction in response to the drawer assembly being slid out of a fully closed position; and a collapsible link assembly positioned within a fixed support rail, wherein the collapsible link assembly includes: a collapsible button assembly positioned proximate an inner surface of the fixed support rail, the collapsible button assembly configured to be displaceable in a second direction in response to the shell assembly being installed onto the fixed support rail and configured to interface with the interlock window, and a pin assembly coupled to the collapsible button assembly and positioned proximate an outer surface of the fixed support rail, wherein the pin assembly is configured to be displaceable in the first direction in response to displacement of the interlock window in the first direction and is configured to interface with a drawer interlock mechanism included within the IT rack, wherein the drawer interlock mechanism is configured to prevent the opening of other IT components within an IT rack while the openable IT component is not in the fully closed position.

\* \* \* \* \*